(12) United States Patent
Goetz

(10) Patent No.: US 11,112,434 B2
(45) Date of Patent: Sep. 7, 2021

(54) SENSOR APPARATUS FOR MEASURING DIRECT AND ALTERNATING CURRENTS

(71) Applicant: Dr. Ing. h.c. F. Porsche Aktiengesellschaft, Stuttgart (DE)

(72) Inventor: Stefan Goetz, Forstern (DE)

(73) Assignee: Dr. Ing. h.c. F. Porsche Aktiengesellschaft

( * ) Notice: Subject to any disclaimer, the term of this patent is extended or adjusted under 35 U.S.C. 154(b) by 9 days.

(21) Appl. No.: 16/779,841

(22) Filed: Feb. 3, 2020

(65) Prior Publication Data

US 2020/0249258 A1   Aug. 6, 2020

(30) Foreign Application Priority Data

Feb. 1, 2019   (DE) ..................... 10 2019 102 567.2

(51) Int. Cl.
*G01R 15/18* (2006.01)
*G01R 33/07* (2006.01)

(52) U.S. Cl.
CPC ......... *G01R 15/181* (2013.01); *G01R 33/072* (2013.01)

(58) Field of Classification Search
CPC .. G01R 15/181; G01R 33/072; G01R 15/202; G01R 15/207; G01R 19/00
See application file for complete search history.

(56) References Cited

U.S. PATENT DOCUMENTS

| | | | | |
|---|---|---|---|---|
| 5,438,257 A * | 8/1995 | Berkcan | ............... | G01R 15/146 324/117 H |
| 6,366,076 B1 * | 4/2002 | Karrer | .................. | G01R 15/181 324/117 R |
| 6,510,038 B1 | 1/2003 | Satou et al. | | |
| 7,605,580 B2 * | 10/2009 | Strzalkowski | ....... | G01R 15/181 324/117 H |
| 9,633,794 B2 | 4/2017 | Jun et al. | | |
| 10,388,445 B2 * | 8/2019 | Gao | ...................... | G01R 15/181 |
| 10,573,803 B1 * | 2/2020 | Hall | ...................... | G01R 15/181 |
| 10,613,120 B2 * | 4/2020 | Takenaka | ............... | G01R 15/20 |
| 10,782,323 B2 * | 9/2020 | Parkhideh | .......... | G01R 19/0092 |
| 2005/0253573 A1 * | 11/2005 | Budillon | .............. | G01R 15/181 324/126 |

(Continued)

FOREIGN PATENT DOCUMENTS

| | | |
|---|---|---|
| DE | 10 2010 028 238 | 5/2011 |
| DE | 10 2010 064 183 | 6/2012 |

OTHER PUBLICATIONS

Luo, F. et al.—"Design of a Hybrid Busbar Filter Combining a Transmission-Line Busbar Filter and a One-Turn Inductor for DC-Fed Three-Phase Motor Drive Systems"—vol. 28, 2013, Nr. 12, S. 5588-5602.

*Primary Examiner* — Patrick Assouad
*Assistant Examiner* — Demetrius R Pretlow
(74) *Attorney, Agent, or Firm* — Gerald E. Hespos; Michael J. Porco; Matthew T. Hespos

(57) ABSTRACT

A sensor apparatus (1) is provided for measuring direct and alternating currents through a conductor (2). The sensor apparatus (1) has a Rogowski coil (3) and the plane of main extent of the Rogowski coil (3) is arranged substantially orthogonally in relation to the direction of main extent of the conductor (2). The conductor (2) is enclosed by the Rogowski coil (3). The sensor apparatus (1) also has a plurality of magnetic field sensors.

11 Claims, 4 Drawing Sheets

(56) References Cited

U.S. PATENT DOCUMENTS

| | | | |
|---|---|---|---|
| 2009/0001964 A1* | 1/2009 | Strzalkowski | G01R 15/202 324/202 |
| 2011/0012589 A1* | 1/2011 | Greenberg | G01R 15/186 324/127 |
| 2011/0094075 A1 | 4/2011 | Lee et al. | |
| 2012/0126789 A1* | 5/2012 | Turpin | G01R 15/181 324/117 R |
| 2014/0253109 A1* | 9/2014 | Singh | G01R 15/181 324/227 |
| 2015/0219692 A1* | 8/2015 | Krah | G01R 15/207 324/117 H |
| 2016/0091535 A1* | 3/2016 | Bannister | G01R 19/0092 324/127 |
| 2016/0202291 A1* | 7/2016 | Gilbert | G01R 15/181 324/750.25 |
| 2017/0315155 A1* | 11/2017 | Smith | G01R 15/181 |
| 2018/0120357 A1* | 5/2018 | Takenaka | G01R 15/18 |
| 2018/0164345 A1* | 6/2018 | Gotz | G01R 15/181 |
| 2018/0164346 A1* | 6/2018 | Gotz | G01R 15/247 |
| 2019/0064225 A1* | 2/2019 | Parkhideh | G01R 15/205 |
| 2019/0346492 A1* | 11/2019 | Worones | G01R 15/205 |
| 2020/0088768 A1* | 3/2020 | Schlafli | G01R 33/022 |
| 2021/0006240 A1* | 1/2021 | Schlafli | H03K 17/0828 |

\* cited by examiner

SENSOR APPARATUS FOR MEASURING DIRECT AND ALTERNATING CURRENTS

CROSS REFERENCE TO RELATED APPLICATION

This application claims priority under 35 USC 119 to German Patent Appl. No. 10 2019 102 567.2 filed on Feb. 1, 2019, the entire disclosure of which is incorporated herein by reference.

BACKGROUND

Field of the Invention

The invention relates to a sensor apparatus for measuring direct and alternating currents in an electrical conductor.

Related Art

Exact current measurements are a central element of power electronics and EMC technology. There, control of an electronic system usually is performed on the basis of current measurements. Current measurement has to have a large number of properties to ensure stable operation of the electronic system given high demands with respect to the quality of operation of the electronic system. Central requirements of current measurement are a high spectral bandwidth, that is to say good functioning of current measurement in the case of low-frequency and in the case of high-frequency alternating currents, a low measurement offset, a low measurement drift, a high dynamic range and exact-phase measurement.

The detection of alternating currents with a high dynamic range, for example of a few µA to several kA, generally takes place with a very high degree of accuracy by means of their magnetic field. Such detection may be carried out with Hall sensors, which usually have high measurement offsets, or with the Rogowski-Steinhaus-Chattock coil (customarily referred to as "Rogowski coil"), which generally is used without a magnetic core and therefore without magnetic inertia, thereby making high-frequency measurement more difficult. The Rogowski coil allows very high bandwidths from the millihertz to the megahertz range, but generates a measurement signal that is produced by magnetic induction and therefore is proportional to the time derivative of the measured current. The Rogowski coil is based on a very simple measurement principle of detecting the derivative of the current to be measured, and therefore functions in manner a very similar to a transformer. On account of the measurement principle that detects the time derivative of the current to be measured by Faraday induction, Rogowski coils cannot measure direct currents in principle. Virtually any desired low frequency can be detected by increasing the sensitivity, but true DC components are inaccessible. However, there is a great deal of interest in measuring direct current components. The prior art discloses a system that uses mathematical integration of the derivative signal of the current already beginning before the sensor apparatus is fitted to the power line or busbar to be measured to ascertain the equivalent value of the current to be measured. However, this system is extremely inaccurate and is limited in respect of bandwidth since, for optimization in the lower spectral range for this function, the quality is accordingly no longer available for high current values at high frequencies. In principle, systems that use plural independent current measurement systems and then combine the information from these current measurement systems in a digital processor could be developed, but the majority of Rogowski coils are used with analog measurement systems or oscilloscopes that expect analog signal inputs. A digital combination would be accompanied by latencies, and potentially subsequent repeated analog conversion in order to pass them on for the further analog processing would have a noticeable adverse effect on the quality of the signal and cause unnecessarily high costs since all converters have to have a high spectral bandwidth and resolution.

An object of the invention is to provide a sensor apparatus that does not exhibit the disadvantages of the prior art, but rather provides a way of measuring alternating and direct currents in a cost-effective and accurate manner.

SUMMARY

This invention relates to a sensor apparatus for measuring direct and alternating currents through a conductor. The sensor apparatus has a Rogowski coil, and the plane of main extent of the Rogowski coil is arranged substantially orthogonally to the direction of main extent of the conductor. The conductor is enclosed by the Rogowski coil. Additionally, the sensor apparatus has a plurality of magnetic field sensors.

The sensor apparatus allows both direct and also alternating current to be measured. In this case, alternating currents are measured with the aid of the Rogowski coil and direct currents are measured with the aid of the magnetic field sensors. A Rogowski coil is a toroidal air-core coil. An electrically conductive wire is wound around an annular core containing air to form a virtually closed circular segment and returned in a magnetically neutral manner from the end of the winding through the core to the start of the winding. If the Rogowski coil is attached to a conductor, the alternating magnetic field of an alternating current flowing through the conductor induces a voltage in the Rogowski coil. The voltage in the Rogowski coil usually is measured with a high impedance. Accordingly, the current in the Rogowski coil is virtually zero and therefore the induced voltage is proportional to the time derivative of the alternating current to be measured. A direct current in the conductor is measured by its magnetic field with the aid of the magnetic field sensors.

It is conceivable for the Rogowski coil to be manufactured with only a low degree of elasticity and insignificant elasticity. Therefore, it is possible for the Rogowski coil to be arranged in a spatially accurately defined position in relation to the conductor. It is further conceivable for the magnetic field sensors to comprise four magnetic field sensors and preferably seven magnetic field sensors. The measurement error drops as the number of magnetic field sensors increases. Seven magnetic field sensors have proven to be particularly advantageous in respect of the ratio of error reduction and expenditure on production.

The magnetic field sensors may be Hall sensors. This allows a direction dependency of the magnetic field to also be detected instead of only the magnitude of the magnetic field. This is particularly advantageous if the current direction is intended to be detected. However, the use of GMR or TMR sensors is also conceivable.

The magnetic field sensors may be arranged in the plane of main extent of the Rogowski coil. The Rogowski coil may be between the conductor and the magnetic field sensors. The measurement error of the magnetic field part increases the farther the conductor moves away from the center of the Rogowski coil and moves closer to a location of the Rogowski coil or to a magnetic field sensor. It has been found that the Rogowski coil is more error-tolerant than the magnetic field sensors, and that therefore the measurement error can drop.

The magnetic field sensors may be arranged on an annular area around the conductor. The conductor may be substantially in the center of the annular area. Distances between adjacent magnetic field sensors along the annular area may be the same. The quality of the measurement improves overall owing to this arrangement of the magnetic field sensors. It is conceivable for the magnetic field sensors to be fastened to the Rogowski coil.

The magnetic field sensors may be arranged such that a measurement direction of the magnetic field sensors lies tangentially in relation to the Rogowski coil and along the plane of main extent of the Rogowski coil. If the conductor, by way of its direction of main extent, is arranged orthogonally in relation to the direction of main extent of the Rogowski coil, the direction tangentially in relation to the Rogowski coil and along the plane of main extent of the Rogowski coil corresponds to the direction of the magnetic field lines that are induced by the direct current to be measured.

The sensor apparatus may have an evaluation electronics system for evaluating the measurement values of the magnetic field sensors. The evaluation electronics system may be an analog evaluation electronics system. The evaluation electronics system can be used to add the value for the measured direct current to the value for the measured alternating current. The evaluation electronics system also can be configured to evaluate the measurement values of the Rogowski coil. The evaluation electronics system may be configured to evaluate the measurement values of the Rogowski coil and to evaluate the measurement values of the magnetic field sensors and also to calculate a total current comprising the direct current and the alternating current through the conductor.

The evaluation electronics system may have a low-pass filter. As a result, undesired high-frequency signals can be filtered out, thereby leading to an improvement in the measurement results.

The evaluation electronics system may have a preamplifier for each magnetic field sensor. More particularly, the evaluation electronics system has an amplifier, and the preamplifiers may be configured to preamplify by a respective preamplification factor. The preamplification factors may be proportional to the distances of the respective magnetic field sensor from its nearest adjacent magnetic field sensors. The respective preamplification factor should be selected such that the Riemann-Steltjes-like discretization of the Stokes integral (Ampere's Law) apart from a constant preamplification factor can be mapped. According to Ampere's Law, the current is therefore $$I = C \cdot \int_\Gamma B \cdot d\gamma \approx C \cdot \sum_i B_{\phi,i} \|r_i - r_{i-1}\| \approx \frac{C}{2} \cdot \sum_i B_{\phi,i} \|r_{i+1} - r_{i-1}\|$$

where $\Gamma$ is a closed loop which is arranged continuously through the magnetic field sensors and so as to run approximately along the Rogowski coil. $d\gamma$ is a vectorial displacement element on the curve $\Gamma$. B is the magnetic field, C is a constant and $r_i$ is the position vector of the i-th magnetic field sensor. $\|r_i - r_{(i-1)}\|$ is the distance of the i-th magnetic field sensor from the nearest adjacent sensor and $\|R_{i+1} - r_{(i-1)}\|$ is the displacement element on the loop $\Gamma$ to either side of the i-th magnetic field sensor. The amplification factors of the respective preamplifiers of the magnetic field sensors i, i+1, ... are preferably given by corresponding dimensioning of the associated resistors $R_i$, $R_j$, ..., which depend on the ratio of the distances of the respective magnetic field sensors from one another:

$$\frac{R_i}{R_j} = \frac{\|r_i - r_{i-1}\|}{\|r_j - r_{j-1}\|}$$

or $$\frac{R_i}{R_j} = \frac{\|r_{i+1} - r_i\|}{\|r_{j+1} - r_j\|}$$

or $$\frac{R_i}{R_j} = \frac{\|r_{i+1} - r_{i-1}\|}{\|r_{j+1} - r_{j-1}\|}$$

Alternatively, the evaluation electronics system may have a preamplifier for joint amplification of all magnetic field sensors. The evaluation electronics system also may have an amplifier. To this end, the magnetic field sensors may be equidistant from one another. This renders it possible to produce the sensor apparatus with a small number of parts and therefore more expediently and in a manner less susceptible to faults. To this end, it is conceivable for the measurement values of the magnetic field sensors to be added up by way of a series connection of the sensor outputs of the magnetic field sensors. In addition, it is conceivable for power supply to the magnetic field sensors to likewise be performed in series.

In some embodiments, the evaluation electronics system may not have a preamplifier. To this end, it is conceivable for the amplifier to have a high input impedance.

The evaluation electronics system may be configured to generate a correction value. More particularly, the evaluation electronics system may be configured to generate a mean value of the measurement values of the magnetic field sensors, to generate difference values of the respective magnetic field sensors, wherein the difference value is the difference between the measurement value of the respective magnetic field sensor and the mean value, and to generate the correction value from the difference values.

Measurement errors of the sensor apparatus are produced, in particular, when the conductor and therefore the current to be measured do not run centrally through the Rogowski coil, and consequently the magnetic field sensors which are situated at approximately the same distance away from the center of the Rogowski coil no longer detect identical flux densities. To this end, the correction value may be generated from the difference between the values respectively measured by the magnetic field sensors.

The invention also relates to a method for measuring direct and alternating currents flowing through a conductor using the above-described sensor apparatus. Thus, an embodiment of the method comprises measuring alternating currents using the Rogowski coil and measuring direct currents using the magnetic field sensors.

All of the statements made above apply equally to the sensor apparatus according to the invention and the method according to the invention.

Further details, features and advantages of the invention can be found in the drawings and also in the following description of preferred embodiments with reference to the drawings. Here, the drawings illustrate only exemplary embodiments of the invention which do not restrict the concept of the invention.

DETAILED DESCRIPTION

Figure 1:
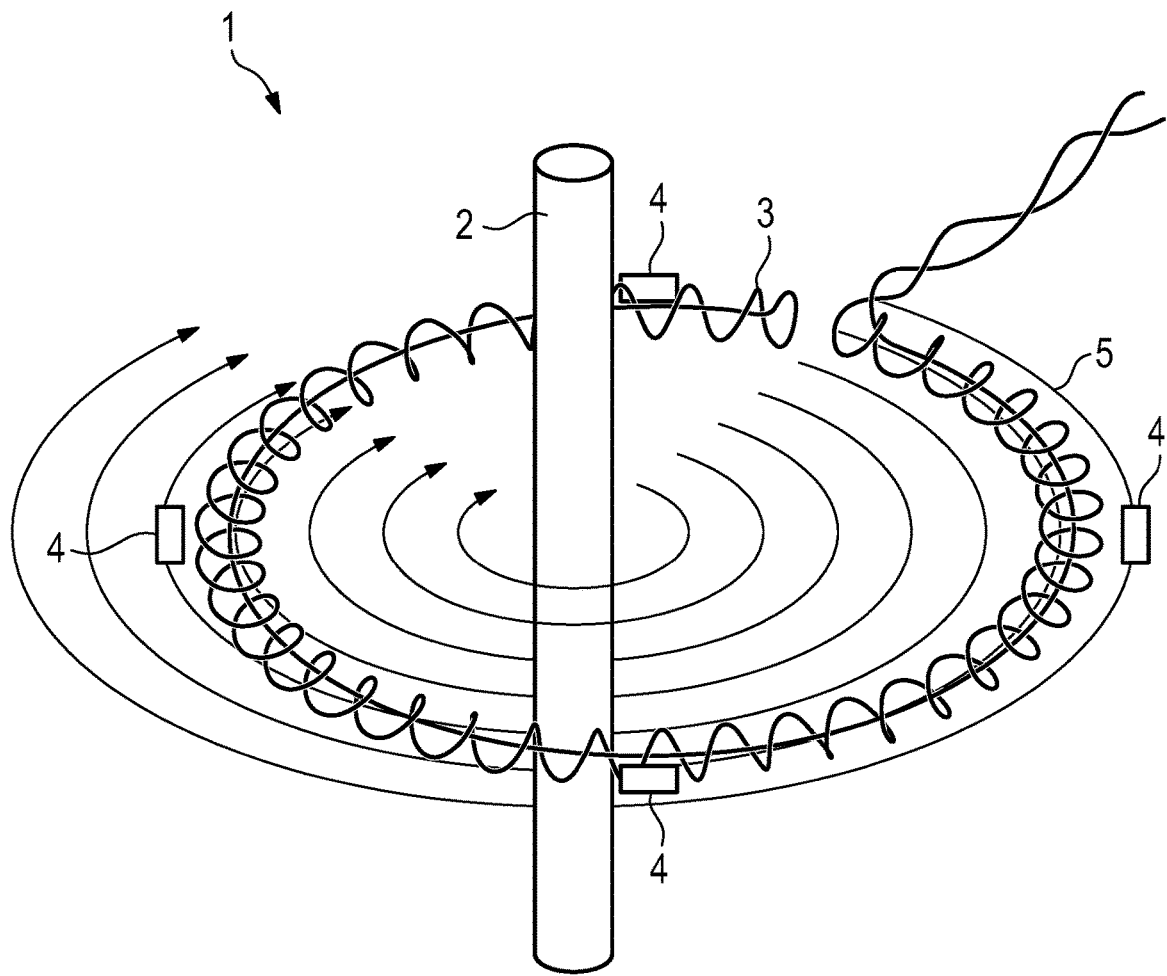
FIG. 1 schematically illustrates the sensor apparatus according to an exemplary embodiment of the present invention.

FIG. 1 schematically shows the sensor apparatus 1 according to an exemplary embodiment of the present invention. The sensor apparatus 1 has the Rogowski coil 3 and the plurality of magnetic field sensors 4, four Hall sensors in the embodiment illustrated here. A direct current flowing through the conductor 2 induces a magnetic field 5 which is detected by the magnetic field sensors 4. In this way, the direct current can be measured with the aid of the magnetic field sensors 4. An alternating current flowing through the conductor 2 induces a voltage in the Rogowski coil, with the aid of which the alternating current is detected.

Figure 2A:
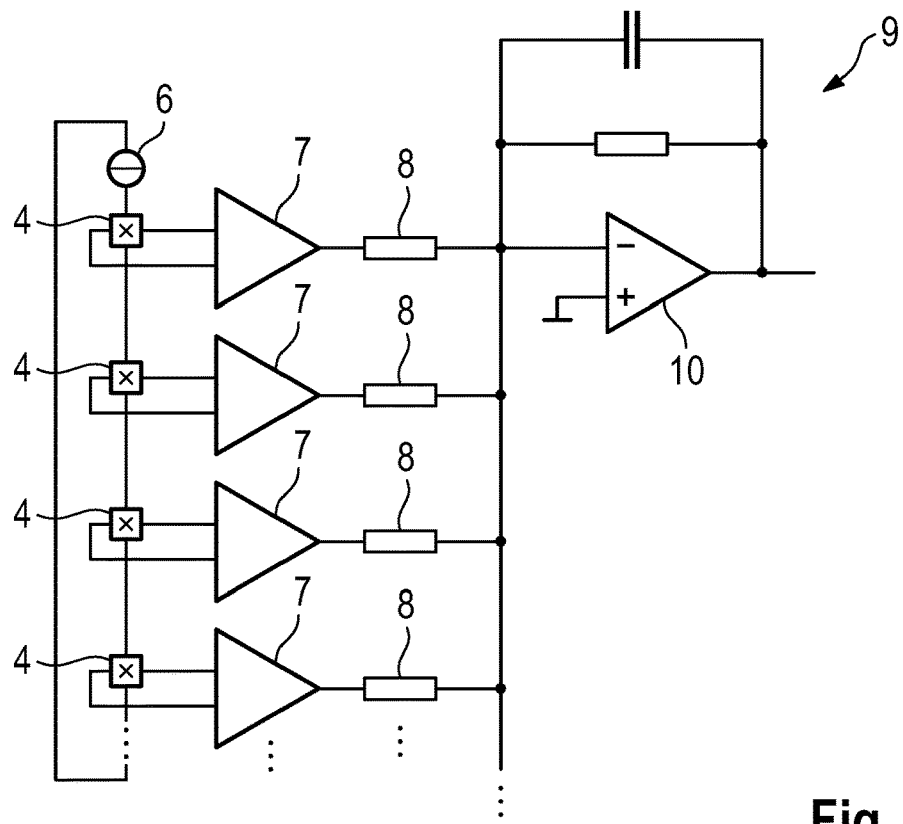
FIGS. 2(a), 2(b), 2(c) and 2(d) each schematically illustrate the evaluation electronics system of the sensor apparatus according to an exemplary embodiment of the present invention.
Figure 2B:
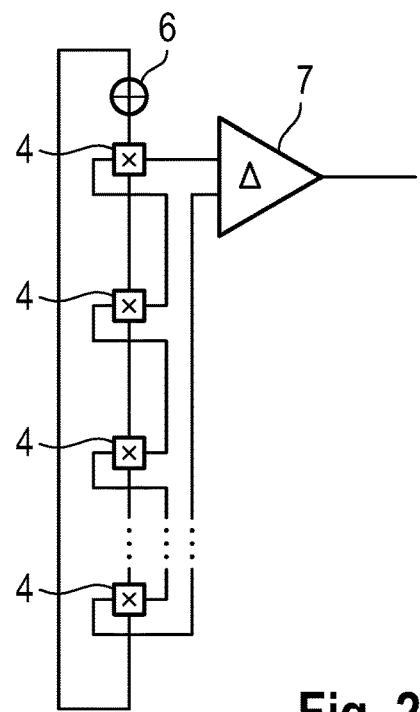
Figure 2C:
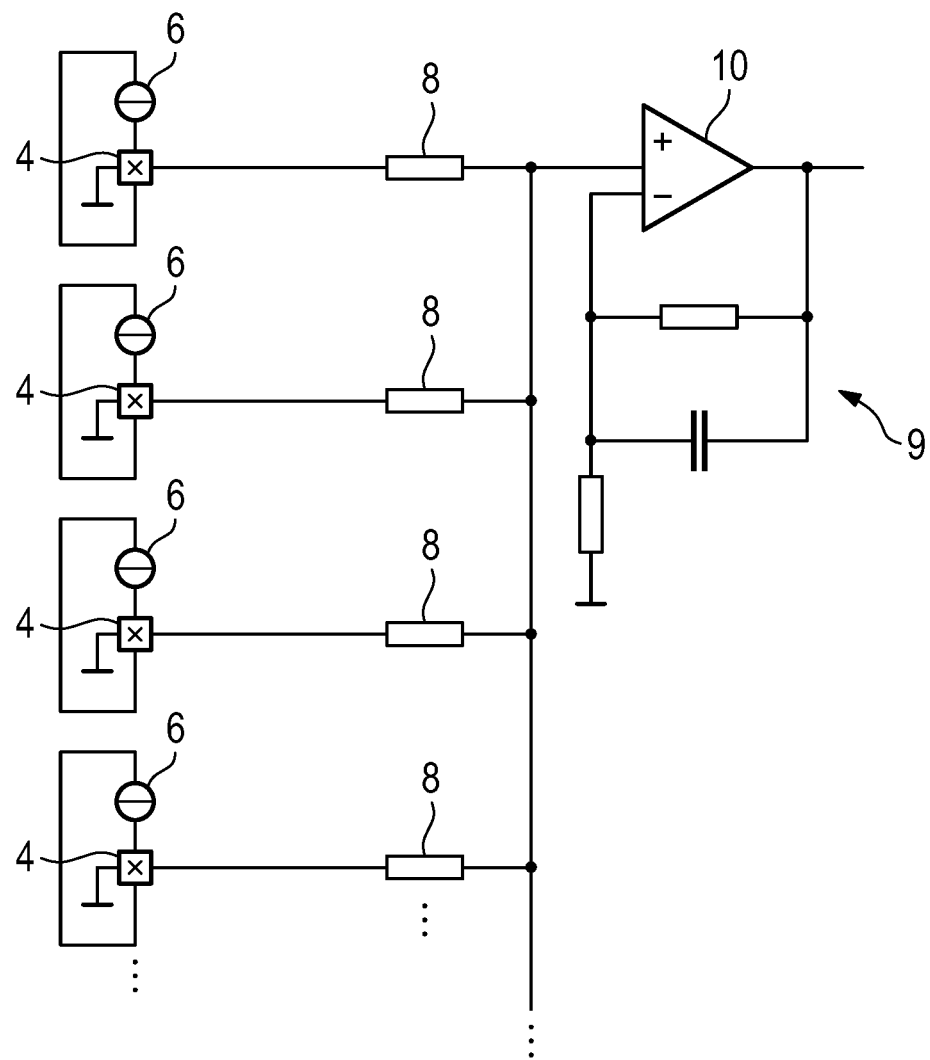
Figure 2D:
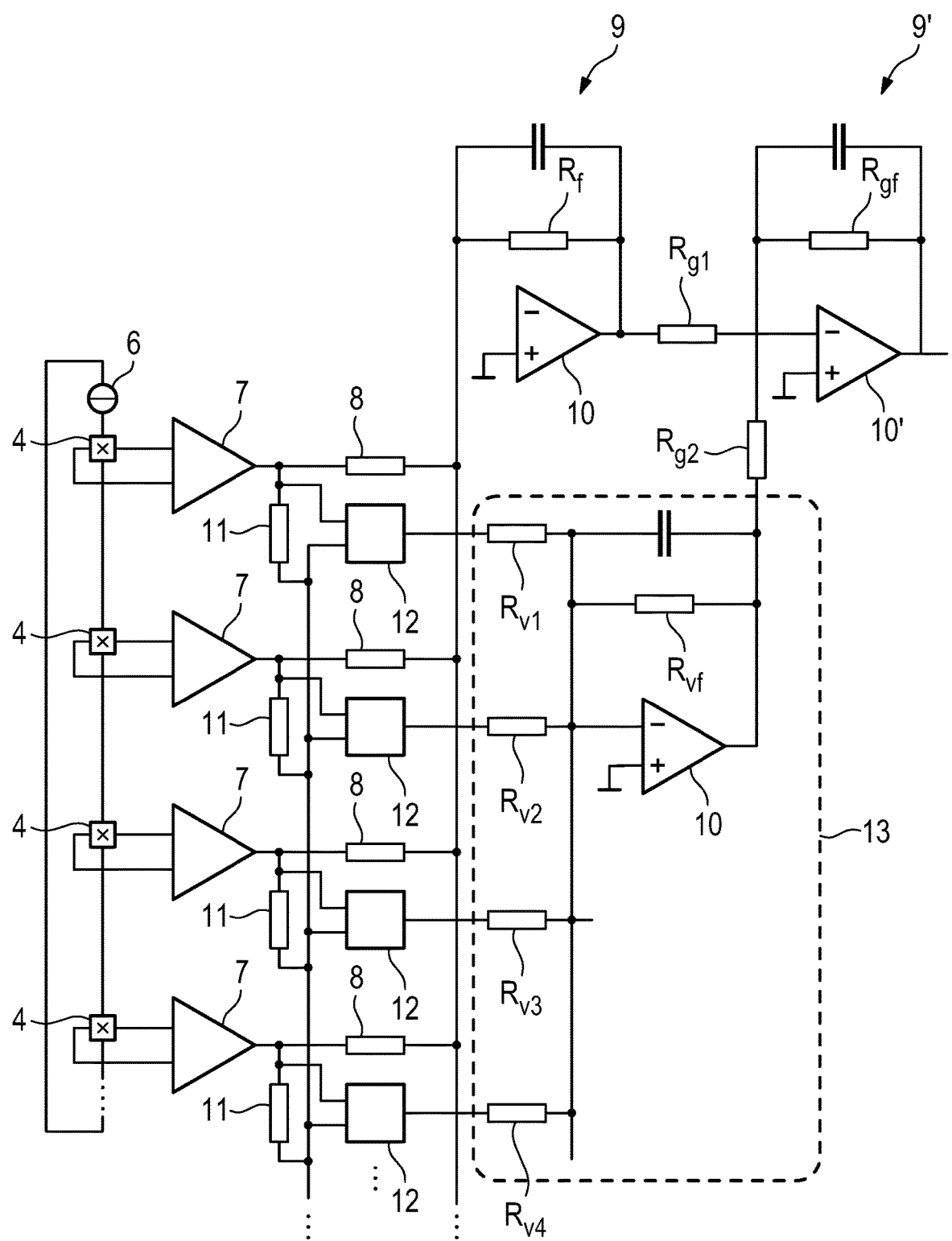

FIGS. 2(a) to (d) each schematically illustrate the evaluation electronics system of the sensor apparatus 1 according to an exemplary embodiment of the present invention. FIG. 2(a) shows the evaluation electronics system according to a first embodiment. The evaluation electronics system has the magnetic field sensors 4, the voltage supply 6 of the magnetic field sensors 4, the preamplifiers 7 and preamplifier resistors 8 belonging to the preamplifiers. The preamplification of the signal of the respective magnetic field sensor 4 is set by adjusting the preamplifier resistors 8. In this case, the respective preamplification resistor 8 is matched to the distances of the associated magnetic field sensor 4 from its nearest adjacent magnetic field sensors 4. Furthermore, the evaluation electronics system has the low-pass filter 9 and the amplifier 10. FIG. 2(b) shows the evaluation electronics system according to a second embodiment. The magnetic field sensors 4 are arranged equidistantly from one another in the sensor apparatus. Therefore, it is possible to not install an individual preamplifier for each magnetic field sensor 4, but rather to use only one preamplifier 7 for all magnetic field sensors 4 overall. Said figure further shows that the voltage supply 6 of the magnetic field sensors 4 takes place in series. However, in an alternative embodiment, not shown, the voltage supply of the individual magnetic field sensors 4 takes place independently of one another. Equalizing currents are avoided in this way. FIG. 2(c) shows the evaluation electronics system according to a third embodiment. In the embodiment shown here, preamplification of the magnetic field sensors 4 is dispensed with and the amplifier 10 is equipped with an appropriately high input impedance. FIG. 2(d) shows the evaluation electronics system according to a fourth embodiment. The summing device 13 creates a correction value for correcting the measurement. To this end, the mean value of the measurement values of the magnetic field sensors 4 is calculated by means of the resistance cascade 11 and the difference between the respective measurement value and the mean value of all measurement values is calculated and squared by means of squaring devices 12, for example by means of analog multipliers such as the AD534. As an alternative, in another embodiment, the absolute value can likewise be used instead of the square in each case. After the subsequent summing, the variance, second stochastic moment, or the first absolute moment of the measurement values, which both quantify the inequality of the measurement values, is correspondingly produced in the event of squaring. Said figure furthermore shows a further low-pass filter 9' and a further amplifier 10'. The correction term can be calibrated by suitable selection of the amplification at the summing device 13 by setting the amplifier. Disregarding the low-pass filter 9 and the further low-pass filter 9', the following output voltage is given by way of example:

$$V_{out} = \frac{R_{g1}}{R_{gf}R_f} \cdot \sum_i R_i \cdot V_{Hall,i} + \frac{R_{g2}}{R_{gf}R_{vf}} \cdot \sum_i R_{vi} \cdot (V_{Hall,i} - \langle V_{Hall,i} \rangle)^2$$

where $R_i$ are the preamplifier resistors 8 of the i-th preamplifier 7, and $V_{Hall,i}$ is the output voltage of the i-th magnetic field sensor 4. In this case, $$\langle V_{Hall,i} \rangle = R_M \sum_j \frac{V_{Hall,j}}{R_M}$$

denotes the mean value of the output voltages of the magnetic field sensors 4, where $R_M$ are the resistors of the resistor cascade 11.

Here, $$\frac{R_{g2}}{R_{gf}R_{vf}}$$

is the amplification factor for setting the weighting of the correction factor. The sum $$\sum_i R_{vi} \cdot (V_{Hall,i} - \langle V_{Hall,i} \rangle)^2$$

corresponds for identical $R_{vi}$ to the variation $\mathrm{Var}\{V_{Hall,i}\}$.

What is claimed is:

1. A sensor apparatus for measuring direct and alternating currents through a conductor, the sensor apparatus comprising: a Rogowski coil, a plane of a main extent of the Rogowski coil being arranged substantially orthogonally to the direction of main extent of the conductor, the conductor being enclosed by the Rogowski coil; and a plurality of magnetic field sensors, wherein:
the sensor apparatus has an evaluation electronics system for evaluating the measurement values of the magnetic field sensors, the evaluation electronics system being an analog evaluation electronics system
the evaluation electronics system has a preamplifier for each magnetic field sensor, and the evaluation electronics system further has an amplifier, the preamplifiers being configured to preamplify by a respective preamplification factor, the preamplification factors being proportional to distances of the respective magnetic field sensor from its nearest adjacent magnetic field sensors.

2. The sensor apparatus of claim 1, wherein the magnetic field sensors are Hall sensors.

3. The sensor apparatus of claim 1, wherein the magnetic field sensors are arranged in the plane of main extent of the Rogowski coil, and the Rogowski coil is arranged between the conductor and the magnetic field sensors.

4. The sensor apparatus of claim 1, wherein the magnetic field sensors are arranged on an annular area around the conductor, the conductor being arranged in the center of the annular area, distances between adjacent magnetic field sensors along the annular area being equal.

5. The sensor apparatus of claim 1, wherein the magnetic field sensors are arranged such that a measurement direction of the magnetic field sensors lies tangentially in relation to the Rogowski coil and along the plane of main extent of the Rogowski coil.

6. The sensor apparatus of claim 1, wherein the evaluation electronics system has a low-pass filter.

7. A sensor apparatus for measuring direct and alternating currents through a conductor, the sensor apparatus comprising: a Rogowski coil, a plane of a main extent of the Rogowski coil being arranged substantially orthogonally to the direction of main extent of the conductor, the conductor being enclosed by the Rogowski coil; and a plurality of magnetic field sensors, wherein:
  the sensor apparatus has an evaluation electronics system for evaluating the measurement values of the magnetic field sensors,
  the evaluation electronics system being an analog evaluation electronics system,
  the evaluation electronics system has a preamplifier for joint amplification of all magnetic field sensors, and
  the evaluation electronics system has an amplifier.

8. A sensor apparatus for measuring direct and alternating currents through a conductor, the sensor apparatus comprising: a Rogowski coil, a plane of a main extent of the Rogowski coil being arranged substantially orthogonally to the direction of main extent of the conductor, the conductor being enclosed by the Rogowski coil; and a plurality of magnetic field sensors, wherein:
  the sensor apparatus has an evaluation electronics system for evaluating the measurement values of the magnetic field sensors,
  the evaluation electronics system being an analog evaluation electronics system,
  the evaluation electronics system is configured to generate a correction value, and the evaluation electronics system being configured:
  to generate a mean value of the measurement values of the magnetic field sensors,
  to generate difference values of the respective magnetic field sensors, where the difference value is a difference between the measurement value of the respective magnetic field sensor and the mean value, and
  to generate the correction value from the difference values.

9. A method for measuring direct and alternating currents flowing through a conductor using the sensor apparatus of claim 1, the method comprising measuring alternating currents using the Rogowski coil and measuring direct currents using the magnetic field sensors.

10. A method for measuring direct and alternating currents flowing through a conductor using the sensor apparatus of claim 7, the method comprising measuring alternating currents using the Rogowski coil and measuring direct currents using the magnetic field sensors.

11. A method for measuring direct and alternating currents flowing through a conductor using the sensor apparatus of claim 8, the method comprising measuring alternating currents using the Rogowski coil and measuring direct currents using the magnetic field sensors.

* * * * *